United States Patent
Ghaddar et al.

(10) Patent No.: US 11,271,596 B2
(45) Date of Patent: Mar. 8, 2022

(54) SYSTEM AND METHOD FOR IDENTIFYING AND DECODING REED-MULLER CODES IN POLAR CODES

(71) Applicant: Samsung Electronics Co., Ltd, Gyeonggi-do (KR)

(72) Inventors: Nadim Ghaddar, San Diego, CA (US); Hamid Saber, San Diego, CA (US); Hsien-Ping Lin, San Diego, CA (US); Jung Hyun Bae, San Diego, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/928,826

(22) Filed: Jul. 14, 2020

(65) Prior Publication Data

US 2021/0099188 A1 Apr. 1, 2021

Related U.S. Application Data

(60) Provisional application No. 62/906,996, filed on Sep. 27, 2019.

(51) Int. Cl.
| | | |
|---|---|---|
| *H03M 13/00* | (2006.01) | |
| *H03M 13/29* | (2006.01) | |
| *H03M 13/45* | (2006.01) | |
| *H03M 13/13* | (2006.01) | |
| *H03M 13/39* | (2006.01) | |

(52) U.S. Cl.
CPC ..... *H03M 13/2948* (2013.01); *H03M 13/136* (2013.01); *H03M 13/3927* (2013.01); *H03M 13/458* (2013.01); *H03M 13/6572* (2013.01)

(58) Field of Classification Search
None
See application file for complete search history.

(56) References Cited

U.S. PATENT DOCUMENTS

| | | | | |
|---|---|---|---|---|
| 2012/0250805 | A1* | 10/2012 | Shin | H04L 27/38 375/341 |
| 2015/0026543 | A1* | 1/2015 | Li | H03M 13/45 714/776 |
| 2015/0063207 | A1* | 3/2015 | Nakamura | H03M 13/3746 370/328 |
| 2015/0295593 | A1* | 10/2015 | Trifonov | H03M 13/13 714/776 |
| 2016/0164581 | A1 | 6/2016 | Kim et al. | |
| 2016/0164629 | A1* | 6/2016 | Ahn | H04L 63/0428 714/776 |
| 2017/0149531 | A1* | 5/2017 | Raza | H03M 13/37 |
| 2018/0048334 | A1* | 2/2018 | Sarkis | H03M 13/611 |

(Continued)

FOREIGN PATENT DOCUMENTS

| | | |
|---|---|---|
| KR | 1020010019917 | 3/2001 |
| WO | WO2018201753 | 11/2018 |

*Primary Examiner* — Mujtaba M Chaudry
(74) *Attorney, Agent, or Firm* — The Farrell Law Firm, P.C.

(57) ABSTRACT

A method and an apparatus are provided for decoding a polar code. A simplified successive cancellation list (SSCL) decoding tree for the polar code is generated. The SSCL decoding tree includes a plurality of nodes. One or more nodes of the plurality of nodes are identified as employing Reed-Muller codes for decoding. Decoding of received log-likelihood ratios (LLRs) is performed using Reed-Muller codes at the one or more nodes. Hard decision values are output from the one or more nodes.

16 Claims, 6 Drawing Sheets

(56) References Cited

U.S. PATENT DOCUMENTS

| | | | |
|---|---|---|---|
| 2018/0167369 A1* | 6/2018 | Shapira | ................ H04W 12/03 |
| 2019/0044540 A1 | 2/2019 | Jiang et al. | |
| 2019/0052487 A1 | 2/2019 | Shelby et al. | |
| 2020/0295786 A1* | 9/2020 | Palgy | .................... H03M 13/13 |

* cited by examiner

SYSTEM AND METHOD FOR IDENTIFYING AND DECODING REED-MULLER CODES IN POLAR CODES

PRIORITY

This application is based on and claims priority under 35 U.S.C. § 119(e) to a U.S. Provisional patent application filed on Sep. 27, 2019 in the United States Patent and Trademark Office (USPTO) and assigned Ser. No. 62/906,996, the contents of which are incorporated herein by reference.

FIELD

The present disclosure relates generally to decoding of polar codes, and more particularly, to a method and system for identifying and decoding Reed-Muller codes in polar codes.

BACKGROUND

Polar codes are capacity achieving codes that have been selected by the $3^{rd}$ Generation Partnership Project (3GPP) as the error correcting code on $5^{th}$ Generation New Radio (5G NR) control channels. Polar codes split the channel into good bit-channels and bad bit-channels.

Polar codes are classically decoded with a successive cancellation decoder (SCD), which has a computational complexity on the order of (N log N) for a code of length N, where N is an integer. However, the serial nature of an SCD also results in a large decoding latency of (N log N). The SCD decoding latency can be reduced to 2N−2, using multidimensional polar decoding where multiplicities of each node of a decoding tree are decoded in parallel. Better decoding performance may be achieved by list decoding polar codes. However, list decoding of a polar code has a computational complexity on the order of O(LN log N) for a list size of L, which is an L-fold increase over that of successive cancellation decoding of a polar code.

Successive cancellation list (SCL) decoding of polar codes suffers from high latency due to its successive decoding nature. Simplified SCL (SSCL) decoding may improve the throughput of SCL decoding by exploiting specific constituent codes of the polar coding structure. The constituent codes identified include rate-0 codes, rate-1 codes, repetition (REP) codes, and single-parity check (SPC) codes.

SUMMARY

According to one embodiment, a method is provided for decoding a polar code. An SSCL decoding tree for the polar code is generated. The SSCL decoding tree includes a plurality of nodes. One or more nodes of the plurality of nodes are identified as employing Reed-Muller codes for decoding. Decoding of received log-likelihood ratios (LLRs) is performed using Reed-Muller codes at the one or more nodes. Hard decision values are output from the one or more nodes.

According to one embodiment, a user equipment (UE) is provided that includes a processor and a non-transitory computer readable storage medium storing instructions. When executed, the instructions cause the processor to generate an SSCL decoding tree for a polar code. The SSCL decoding tree comprises a plurality of nodes. The instructions also cause the processor to identify one or more nodes of the plurality of nodes as employing Reed-Muller codes for decoding. The instructions further cause the processor to perform decoding of received LLRs using Reed-Muller codes at the one or more nodes, and output hard decision values from the one or more nodes.

BRIEF DESCRIPTION OF THE DRAWINGS

The above and other aspects, features, and advantages of certain embodiments of the present disclosure will be more apparent from the following detailed description, when taken in conjunction with the accompanying drawings, in which.

DETAILED DESCRIPTION

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate the existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, such as, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

The present system and method is directed toward the identification of constituent codes in an SSCL decoding tree of a polar code that belongs to the family of Reed-Muller codes. Decoding schemes that utilize the symmetric structure of Reed-Muller codes may be employed at those nodes. Specifically, Reed-Muller decoding is incorporated or applied into SSCL decoding of polar codes, which improves and reduces the decoding latency without sacrificing any loss in block error rate performance.

Herein, the terms node and code may be used interchangeably. Maximum likelihood (ML) decoding of Reed-Muller codes may be performed efficiently using a Hadamard decoder, as described in greater detail below.

Figure 1:
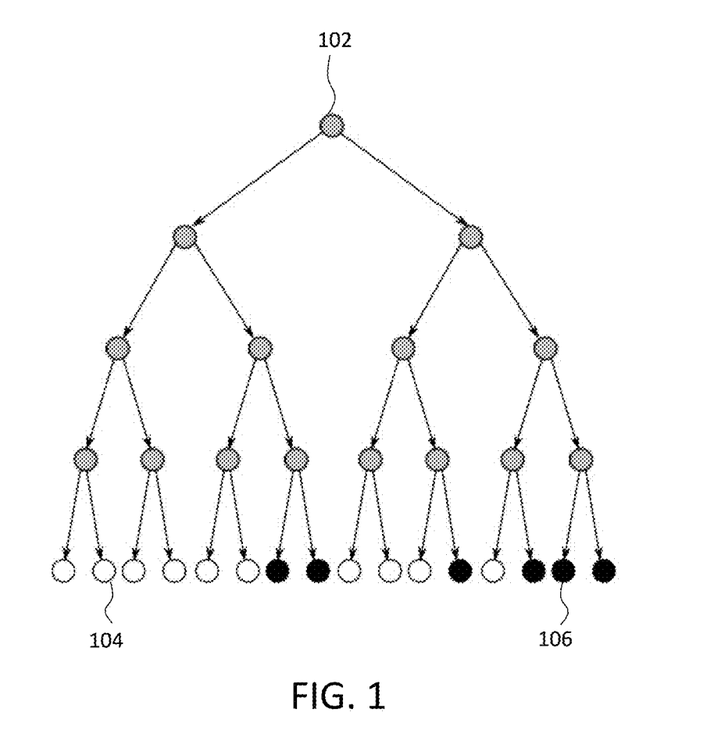
FIG. 1 is a diagram illustrating an SCL decoding tree for a polar code.

FIG. 1 is a diagram illustrating an SCL decoding tree for a polar code. Specifically, FIG. 1 illustrates an SCL decoding tree of a length-16 polar code. Each node 102 of the tree is associated with a constituent code. Vectors of LLRs for the code bits are provided from parent nodes to child nodes, while hard decision values of the code bits are provided back from child nodes to parent nodes. White nodes 104 represent frozen bits of the length-16 polar code, while black nodes 106 represent information bits of the length-16 polar code. Shaded nodes represent nodes that are traversed in the decoding tree in order to determine the frozen bits and the information bits.

Figure 2:
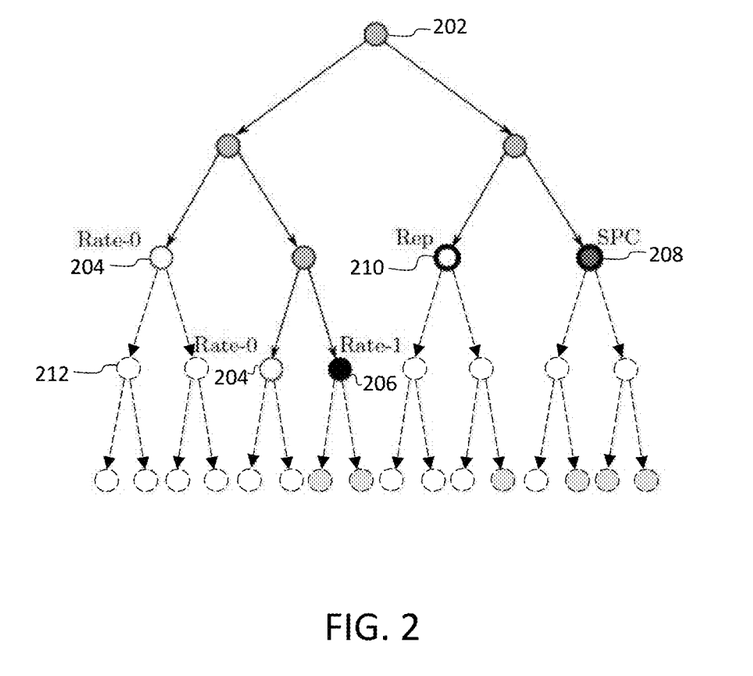
FIG. 2 is a diagram illustrating an SSCL decoding tree for a polar code.

FIG. 2 is a diagram illustrating an SSCL decoding tree for a polar code. Specifically, FIG. 2 illustrates an SSCL decoding tree for the same length-16 polar code of FIG. 1. Each node 202 of the tree is associated with a constituent code. Four types of SNs are identified: a Rate-0 node 204 that employs a Rate-0 code; a Rate-1 node 206 that employs a Rate-1 code; an SPC node 208 that employs an SCP code; and a REP node 210 that employs a REP code. Shaded nodes are traversed, and nodes 212 that are represented by broken lines are not traversed since they are children of SNs. Thus, the decoding latency of the SSCL decoder can be significantly smaller than that of the SCL decoder of FIG. 1.

Figure 3:
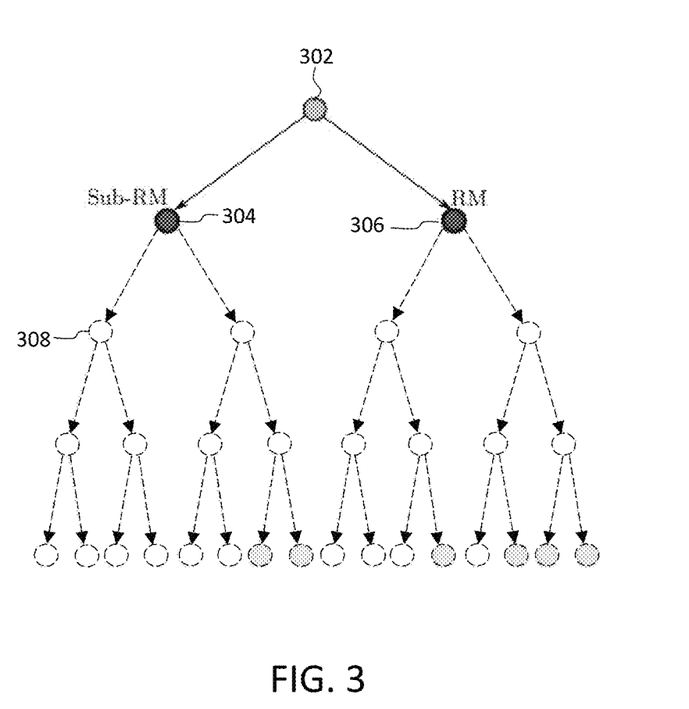
FIG. 3 is a diagram illustrating an SSCL decoding tree with new special nodes (SNs), according to an embodiment.

FIG. 3 is a diagram illustrating an SSCL decoding tree with new SNs, according to an embodiment. Specifically, FIG. 3 illustrates an SSCL decoding tree for the same length-16 polar code of FIGS. 1 and 2. Each node of the tree is associated with a constituent code. A Reed-Muller sub-code (Sub-RM) node 304 and a Reed-Muller (RM) node 306 are identified as child nodes of a parent node 302. Once the decoding reaches the Sub-RM node 304, a Hadamard decoder takes over the decoding task and outputs a set of hard decision values to the parent node 302. The hard decision values are then used to calculate the LLRs for the RM node 306. The Hadamard decoder is employed again to perform the decoding of the RM node 306. The SSCL decoder of FIG. 3 differs from the SSCL decoder of FIG. 2 in that in FIG. 3, the Hadamard decoder is employed to process each RM node and Sub-RM node instead of SSCL decoding.

Similar to FIG. 2, nodes 308 that are represented with broken lines are not traversed since they are children of SNs, and thus, the decoding latency of the SSCL decoder can be significantly smaller than that of the SCL decoder of FIG. 1 and the SSCL decoder of FIG. 2.

According to an embodiment, the Sub-RM node 304 and the RM node 306 are added to the types of SNs that are used in the SSCL decoding tree. Thus, an SSCL decoding tree may include Rate-0 nodes, Rate-1 nodes, SPC nodes, REP nodes, Sub-RM nodes, and/or RM nodes.

Codewords in first-order Reed-Muller codes are evaluations of polynomials in $\mathbb{F}_2[Z_1, \ldots, Z_m]$ having a degree of at most one, i.e., each codeword $c \in RM(m, 1)$ may be represented as a polynomial in the form set forth below in Equation (1).

$$u_0 + \Sigma_{i=1}^m u_i Z_i, \qquad (1)$$

where $u = (u_0, \ldots, u_m) \in \mathbb{F}_2^{m+1}$ is the information vector, and the codeword c is the evaluation of this polynomial at each $z = (z_1, \ldots, z_m) \in \mathbb{F}_2^m$. For example, the first bit of codeword c is the evaluation of the polynomial at $(0, \ldots, 0) \in \mathbb{F}_2^m$, while the last bit of codeword c is the evaluation of the polynomial at $(1, \ldots, 1) \in \mathbb{F}_2^m$. Each bit of the codeword c can be indexed by the binary vectors in $\mathbb{F}_2^m$, i.e., c(z) corresponds to the bit of the codeword c that is equal to the evaluation of the polynomial at z ML decoding of a Reed-Muller code is represented as set forth below in Equation (2).

$$\hat{c}_{ML} = \mathrm{argmax}_{c \in RM(m,1)} \sum_{z \in \mathbb{F}_2^m} (-1)^{c(z)} LLR(c(z)) \quad (2)$$

Since $c(z) = u_o + \Sigma_{i=1}^m u_i z_i$, the present system determines $u = (u_o, \ldots, u_m) \in \mathbb{F}_2^{m+1}$ in order to maximize Equation (3) below.

$$(-1)^{u_0} \sum_{z \in \mathbb{F}_2^m} (-1)^{\sum_{i=1}^m u_i z_i} LLR(c(z)) \quad (3)$$

For a binary vector $u = (u_1, \ldots, u_m) \in \mathbb{F}_2^m$, L(u) is defined as set forth in Equation (4).

$$L(u) = \sum_{z \in \mathbb{F}_2^m} (-1)^{\sum_{i=1}^m u_i z_i} LLR(c(z)) \quad (4)$$

(L(u), $u \in \mathbb{F}_2^m$) is the Hadamard transform of the vector (LLR(z), $z \in \mathbb{F}_2^m$), which can be efficiently calculated in O(N log N), where $N = 2^m$.

Once (L(u), $u \in \mathbb{F}_2^m$) is achieved, $u^* = (u_1^*, \ldots, u_m^*)$ may be determined which maximizes |L(u)|. If $L(u^*) > 0$, the output of the decoder is $(u_o^* = 0, u_1^*, \ldots, u_m^*)$. Otherwise, the output of decoder is $(u_0^* = 1, u_1^*, u_m^*)$.

To find the most probable L candidates, a set of L vectors $(u_1^*, \ldots, u_L^*)$ with a maximum |L(u)| may be determined, and the first bit of every candidate may be decoded, as described above (i.e., depending on the sign of L(u*)).

The Hadamard decoder provides likelihood metrics of each codeword in the first-order Reed-Muller codebook. Thus, the output of the Hadamard decoder may be used to decode any sub-code of the codebook. For example, consider a first-order Reed-Muller code, having the pattern of information and frozen bits as shown in Equation (5).

RM1_pattern=(F,F,F,I,F,I,I,I) (5)

Assuming that the decoder comes across a node with the pattern of information and frozen bits shown in Equation (6):

RM1_sub_pattern=(F,F,F,F,F,I,I,I) (6)

This would correspond to a sub-code of the Reed-Muller code of length 8. Therefore, the Hadamard transformation may be applied to determine likelihood metrics of each Reed-Muller codeword. Instead of considering all metrics, the subset that corresponds to the sub-code of the Reed-Muller code may be considered.

First-order Reed-Muller codes, along with their sub-codes, are identified in the decoding tree of polar codes and the Hadamard decoder is applied at those nodes. The complexity of the Hadamard decoder is O(N log N), where N is the code block length. Using the Hadamard decoder is more efficient than traversing the sub-tree of these nodes.

First-order Reed-Muller codes and their sub-codes occur frequently as constituent codes in the decoding of 5G NR polar codes, in addition to Rate-0 codes, Rate-1 codes, SPC codes, and REP codes. For most aggregation levels and downlink control information (DCI) sizes, several first-order Reed-Muller nodes occur in the decoding tree, of various node sizes, up to a node size of 64. Similarly, nodes that correspond to the sub-codes of first-order Reed-Muller codes, are also identified.

In a 5G NR polar code for an aggregation level of 4 and DCI size of 100 bits, 2 first-order Reed-Muller nodes of length 8, 1 of length 16, and 1 of length 32 exist. Additionally, 1 sub-code of a Reed-Muller code of length 8, 1 of length 16, and 3 of length 32 exist in the 5G NR polar code.

Figure 4:
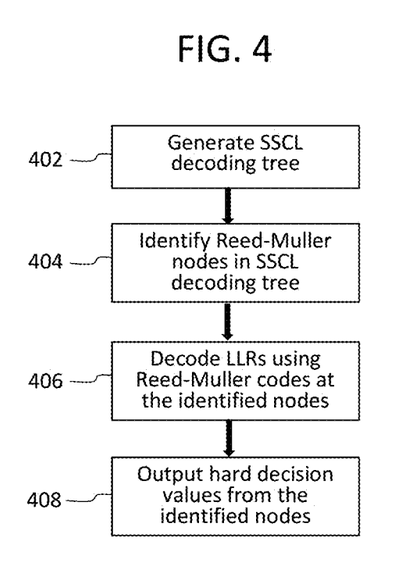
FIG. 4 is a flowchart illustrating a method for decoding a polar code, according to an embodiment.

FIG. 4 is a flowchart illustrating a method for decoding a polar code, according to an embodiment. At 402, an SSCL decoding tree is generated for the polar code. The SSCL decoding tree includes a plurality of nodes. Each node is associated with a constituent code. The SSCL decoding tree determines frozen bits and information bits of the polar code. At 404, one or more nodes of the plurality of nodes are identified as employing Reed-Muller codes for decoding. The Reed-Muller codes may include first-order Reed-Muller codes and sub-codes of Reed-Muller codes. At least one node of the plurality of nodes may also be identified as employing Rate-0, Rate-1, SPC, or REP codes for decoding. At 406, decoding of received LLRs using Reed-Muller codes is performed at the one or more nodes. ML decoding is performed using a Hadamard decoder. At 408, hard decision values are output from the one or more nodes. The hard decision values are output to a parent node of the one or more nodes, and child nodes of the one or more nodes are not traversed in the SSCL decoding tree.

Figure 5:
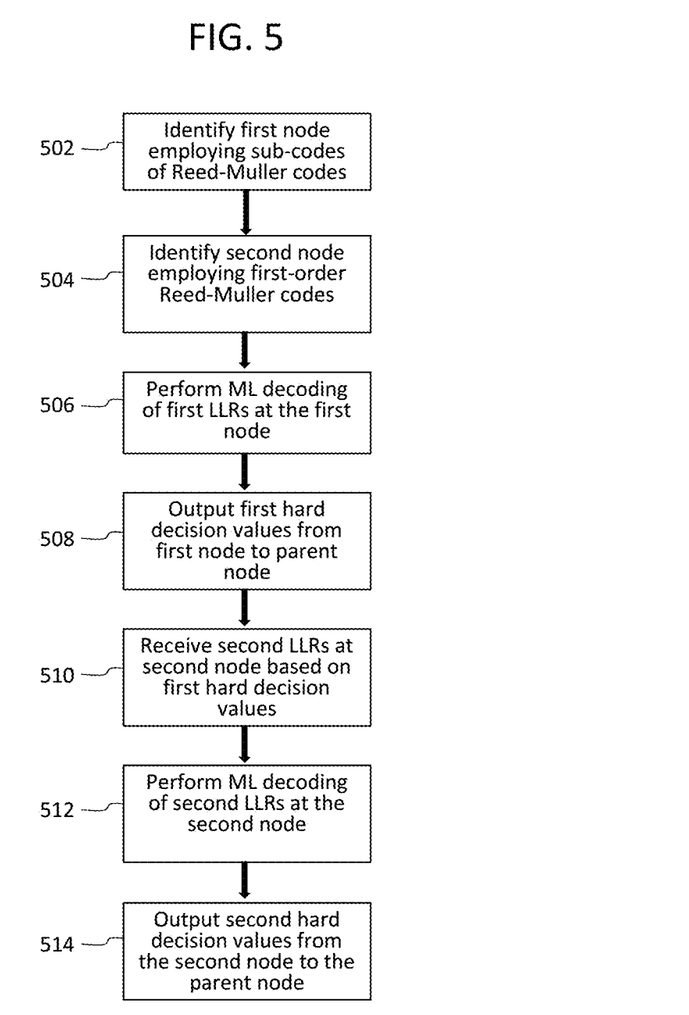
FIG. 5 is a flowchart illustrating a method for decoding SNs of an SSCL decoding tree, according to an embodiment.

Referring now to FIG. 5, a flowchart illustrates a method for decoding in SNs of an SSCL decoding tree, according to an embodiment. At 502, a first node is identified as employing sub-codes of Reed-Muller codes. At 504, a second node is identified as employing first-order Reed-Muller codes. At 506, ML decoding of first LLRs is performed at the first node using a Hadamard decoder. At 508, first hard decision values are output from the first node to a parent node. At 510, second LLRs are received at the second node from the parent node based on the first hard decision values. At 512, ML decoding of the second LLRs is performed at the second node using the Hadamard decoder. At 514, second hard decision values are output from the second node to the parent node.

Figure 6:
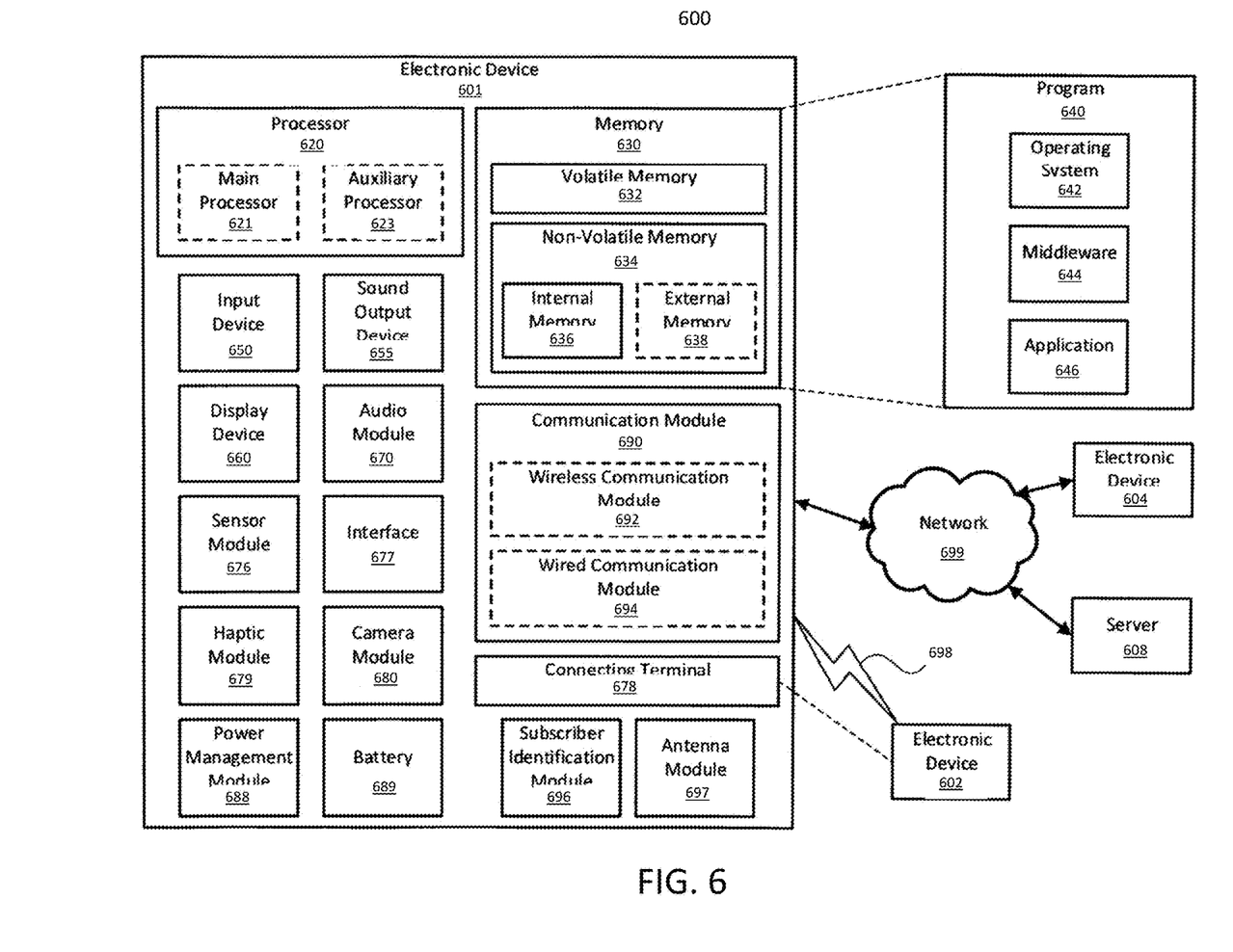
FIG. 6 is a block diagram of an electronic device in a network environment, according to an embodiment.

FIG. 6 is a block diagram of an electronic device in a network environment, according to one embodiment. Referring to FIG. 6, an electronic device 601 in a network environment 600 may communicate with an electronic device 602 via a first network 698 (e.g., a short-range wireless communication network), or an electronic device 604 or a server 608 via a second network 699 (e.g., a long-range wireless communication network). The electronic device 601 may communicate with the electronic device 604 via the server 608. The electronic device 601 may include a processor 620, a memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) 696, or an antenna module 697. In one embodiment, at least one (e.g., the display device 660 or the camera module 680) of the components may be omitted from the electronic device 601, or one or more other components may be added to the electronic device 601. Some of the components may be implemented as a single integrated circuit (IC). For example, the sensor module 676 (e.g., a fingerprint sensor, an iris sensor, or an illuminance sensor) may be embedded in the display device 660 (e.g., a display).

The processor 620 may execute, for example, software (e.g., a program 640) to control at least one other component (e.g., a hardware or a software component) of the electronic device 601 coupled with the processor 620, and may perform various data processing or computations. As at least part of the data processing or computations, the processor 620 may load a command or data received from another component (e.g., the sensor module 676 or the communication module 690) in volatile memory 632, process the command or the data stored in the volatile memory 632, and store resulting data in non-volatile memory 634. The processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or execute a particular function. The auxiliary processor 623 may be implemented as being separate from, or a part of, the main processor 621.

The auxiliary processor 623 may control at least some of the functions or states related to at least one component (e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). The auxiliary processor 623 (e.g., an image signal processor or a communication processor) may be implemented as part of another component (e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory 634.

The program 640 may be stored in the memory 630 as software, and may include, for example, an operating system (OS) 642, middleware 644, or an application 646.

The input device 650 may receive a command or data to be used by other component (e.g., the processor 620) of the electronic device 601, from the outside (e.g., a user) of the electronic device 601. The input device 650 may include, for example, a microphone, a mouse, or a keyboard.

The sound output device 655 may output sound signals to the outside of the electronic device 601. The sound output device 655 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. The display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. The audio module 670 may obtain the sound via the input device 650, or output the sound via the sound output device 655 or a headphone of an external electronic device 602 directly (e.g., wired) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. The sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device 602 directly (e.g., wired) or wirelessly. The interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device 602. The connecting terminal 678 may include, for example, an HDMI connector, a USB connector, an SD card connector, or an audio connector (e.g., a headphone connector).

The haptic module 679 may convert an electrical signal into a mechanical stimulus (e.g., a vibration or a movement) or an electrical stimulus which may be recognized by a user via tactile sensation or kinesthetic sensation. The haptic module 679 may include, for example, a motor, a piezoelectric element, or an electrical stimulator.

The camera module 680 may capture a still image or moving images. The camera module 680 may include one or more lenses, image sensors, image signal processors, or flashes.

The power management module 688 may manage power supplied to the electronic device 601. The power management module 688 may be implemented as at least part of, for example, a power management integrated circuit (PMIC).

The battery 689 may supply power to at least one component of the electronic device 601. The battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the AP) and supports a direct (e.g., wired) communication or a wireless communication. The communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or a standard of the Infrared Data Association (IrDA)) or the second network 699 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The antenna module 697 may transmit or receive a signal or power to or from the outside (e.g., the external electronic device) of the electronic device 601. The antenna module 697 may include one or more antennas, and, therefrom, at least one antenna appropriate for a communication scheme used in the communication network, such as the first network 698 or the second network 699, may be selected, for example, by the communication module 690 (e.g., the wireless communication module 692). The signal or the power may then be transmitted or received between the communication module 690 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

Commands or data may be transmitted or received between the electronic device 601 and the external electronic device 604 via the server 608 coupled with the second network 699. Each of the electronic devices 602 and 604 may be a device of a same type as, or a different type, from the electronic device 601. All or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

One embodiment may be implemented as software (e.g., the program 640) including one or more instructions that are stored in a storage medium (e.g., internal memory 636 or external memory 638) that is readable by a machine (e.g., the electronic device 601). For example, a processor of the electronic device 601 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Story™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method for decoding a polar code, the method comprising:
   generating, by a processor of a user equipment (UE), a decoder with a simplified successive cancellation list (SSCL) decoding tree for the polar code, wherein the SSCL decoding tree comprises a plurality of nodes;
   differentiating, by the processor, a first node of the plurality of nodes that employs sub-codes of Reed-Muller codes for decoding, and a second node of the plurality of nodes that employs first-order Reed-Muller codes for decoding;

controlling, by the processor, the decoder to decode first received log-likelihood ratios (LLRs) using the sub-codes of Reed-Muller codes at the first node, and decode second received LLRs using the first-order Reed-Muller codes at the second node; and receiving, at the processor, hard decision values from the first and second nodes as output from the decoder.

2. The method of claim 1, wherein each node of the plurality of nodes is associated with a constituent code.

3. The method of claim 1, wherein controlling the decoder comprises:
controlling the decoder to perform maximum likelihood (ML) decoding using a Hadamard decoder.

4. The method of claim 1, wherein the SSCL decoding tree determines frozen bits and information bits of the polar code.

5. The method of claim 1, wherein child nodes of the first node and the second node are not traversed in the SSCL decoding tree.

6. The method of claim 1, wherein controlling the decoder and receiving the hard decision values comprises:
controlling, by the processor, the decoder to perform ML decoding of the first LLRs at the first node using a Hadamard decoder;
outputting first hard decision values from the first node to a parent node;
providing, by the processor, the second LLRs from the parent node, to the second node, based on the first hard decision values;
controlling, by the processor, the decoder to perform ML decoding of the second LLRs at the second node using the Hadamard decoder; and
outputting second hard decision values from the second node to the parent node.

7. The method of claim 1, wherein the hard decision values are output to a parent node of the first node and the second node.

8. The method of claim 1, further comprising:
identifying at least one node of the plurality of nodes as employing Rate-0, Rate-1, single-parity check, or repetition codes for decoding.

9. A user equipment (UE) comprising:
a processor; and
a non-transitory computer readable storage medium storing instructions that, when executed, cause the processor to:
generate a decoder with a simplified successive cancellation list (SSCL) decoding tree for a polar code, wherein the SSCL decoding tree comprises a plurality of nodes;
differentiating a first node of the plurality of nodes that employs sub-codes of Reed-Muller codes for decoding, and a second node of the plurality of nodes that employs first-order Reed-Muller codes for decoding;
control the decoder to decode first received log-likelihood ratios (LLRs) using sub-codes of Reed-Muller codes at the first node, and decode second received LLRs using the first-order Reed-Muller codes at the second node; and
receive hard decision values from the first and second nodes as output from the decoder.

10. The UE of claim 9, wherein each node of the plurality of nodes is associated with a constituent code.

11. The UE of claim 9, wherein, in controlling the decoder, the instructions further cause the processor to:
control the decoder to perform maximum likelihood (ML) decoding using a Hadamard decoder.

12. The UE of claim 9, wherein the SSCL decoding tree determines frozen bits and information bits of the polar code.

13. The UE of claim 9, wherein child nodes of the first node and the second node are not traversed in the SSCL decoding tree.

14. The UE of claim 9, wherein, in controlling the decoder and receiving the hard decision values, the instructions further cause the processor to:
control the decoder to perform ML decoding of the first LLRs at the first node using a Hadamard decoder;
output first hard decision values from the first node to a parent node;
provide the second LLRs from the parent node, to the second node, based on the first hard decision values;
control the decoder to perform ML decoding of the second LLRs at the second node using the Hadamard decoder; and
output second hard decision values from the second node to the parent node.

15. The UE of claim 9, wherein the hard decision values are output to a parent node of the first node and the second node.

16. The UE of claim 9, wherein the instructions further cause the processor to:
identify at least one node of the plurality of nodes as employing Rate-0, Rate-1, single-parity check, or repetition codes for decoding.

* * * * *